United States Patent [19]
Gutierrez, Jr. et al.

[11] Patent Number: 5,214,680
[45] Date of Patent: May 25, 1993

[54] CMOS PSEUDO-NMOS PROGRAMMABLE CAPACITANCE TIME VERNIER AND METHOD OF CALIBRATION

[75] Inventors: Alberto Gutierrez, Jr., Fort Collins; Christopher Koerner, Longmont, both of Colo.; Masaharu Goto, Hanno, Japan; James O. Barnes, Fort Collins, Colo.

[73] Assignee: Hewlett-Packard Company, Palo Alto, Calif.

[21] Appl. No.: 786,447

[22] Filed: Nov. 1, 1991

[51] Int. Cl.$^5$ .............................. H03K 3/017
[52] U.S. Cl. ................................. 377/20; 307/597; 307/269; 307/603
[58] Field of Search ............... 307/597, 603, 269; 377/20

[56] References Cited

U.S. PATENT DOCUMENTS

| | | | |
|---|---|---|---|
| 4,458,165 | 7/1984 | Jackson | 307/603 |
| 4,504,749 | 3/1985 | Yoshida | 307/590 |
| 4,700,089 | 10/1987 | Fujii et al. | 307/605 |
| 4,745,310 | 5/1988 | Swepp | 307/597 |
| 4,754,164 | 6/1988 | Flora et al. | 307/269 |
| 4,806,804 | 2/1989 | O'Leary | 307/605 |
| 4,899,071 | 2/1990 | Morales | 307/605 |
| 4,947,064 | 8/1990 | Kim et al. | 307/594 |
| 5,103,112 | 4/1992 | Briggs | 307/265 |
| 5,118,975 | 6/1992 | Hillis et al. | 307/597 |
| 5,122,676 | 6/1992 | Stewart et al. | 307/265 |

OTHER PUBLICATIONS

"A 10-ps Resolution, Process-Insensitive Timing Generator IC", Otsuji et al., IEEE Journal of Solid-State Circuits, vol. 24, No. 5, Oct. 19, 1989, pp. 1412-1418.
"A 3-ns Range . . . Utilizing Si Bipolar", Otsuji et al., IEEE Journal of Solid State Circuits, vol. 26, No. 5, May 19, 1991, pp. 806-811.
"Integrated Pin Electronics for VLSI Functional Testers", Gasbarro et al., IEEE Journal of Solid State Circuits, vol. 24, No. 2, Apr. '89, pp. 331-337.
"Bt605 125 MHz 10KH ECL Compatible Programmable Timing Edge Vernier" Brooktree Corp. 9950 Barnes Canyon Rd., San Diego, Calif. 92121, pp. 9-1-7-9-28.
"Integrated Pin Electronics For A VLSI Test System", Branson et al., IEEE 1988 International Test Conference, pp. 23-27.

Primary Examiner—William L. Sikes
Assistant Examiner—Scott A. Ouellette
Attorney, Agent, or Firm—Guy J. Kelley

[57] ABSTRACT

The present invention is a time vernier providing fine timing control of an input signal having coarse timing edges. The time vernier comprises a receiving means for receiving a value representing a desired time delay to be added to the coarse timing edge input. The desired time delay may have both fine and coarse delay aspects. The time vernier also comprises a first decoding means for decoding the fine delay aspect and generating fine delay control signals, as well as a second decoding means for decoding a coarse delay aspect and generating coarse delay control signals. A delay line is also included in the time vernier which has inputs to receive the input signal having coarse timing edges, the fine and coarse delay control signals, and a control voltage which automatically adjusts with temperature and power supply variations, so as to provide for temperature and power supply compensation. The delay line combines the fine and coarse delay signals to provide an output signal with fine timing edges. Furthermore, the architecture of the present invention enables an automated method of calibration in order to adjust fine and coarse delay elements for fabrication process variations and photolithography variations.

10 Claims, 4 Drawing Sheets

CMOS PSEUDO-NMOS PROGRAMMABLE CAPACITANCE TIME VERNIER AND METHOD OF CALIBRATION

CROSS REFERENCE TO RELATED APPLICATIONS

The following applications are of common assignee and contain some common disclosure, and are believed to have an effective filing date identical with that of the present application:

VARIABLE WIDTH CURRENT MIRROR DIGITAL-TO-ANALOG CONVERTER (DAC) SYSTEM AND METHOD FOR GENERATING A CONTROL VOLTAGE FOR DELAY GENERATION, Ser. No. 07/786,690;

PSEUDO-NMOS PROGRAMMABLE CAPACITANCE DELAY ELEMENT, Ser. No. 07/786,633;

CMOS PSEUDO-NMOS PROGRAMMABLE CAPACITANCE TIME VERNIER SYSTEM AND METHOD FOR CONTROLLED DELAY OF TIMING EDGES, Ser. No. 07/786,695; and, PSEUDO-NMOS FINE/COARSE WIRED-OR TAPPED DELAY LINE, Ser. No. 07/786,459.

The disclosures of the above-listed applications are incorporated herein by reference as if set forth in full below.

BACKGROUND OF THE INVENTION

1. Field of the Invention

The present invention relates generally to electronic systems where accurate and stable signal edge placement is required. More particularly the present invention relates to a CMOS-NMOS programmable capacitance time vernier and a method for calibrating the same.

2. Related Art

Conventionally, manufacturers of test systems for integrated circuits have used bipolar technology to implement the timing control. However, high power solutions such as those implemented with bipolar technology limit the functionality as compared to a low power technology such as CMOS (Complementary Metal Oxide Semiconductor). Further, high power solutions often require the addition of water cooling in order to maintain a workable system environment.

Those skilled in the art understand that solutions utilizing CMOS technology rather than bipolar technology greatly reduce the system power requirement and may therefore obviate water cooling. CMOS technology offers more functionality at a greatly reduced power.

One aspect of test system development that the inventors are involved with is the design of vector formatters. A vector formatter generates coarse timing edges used for testing integrated circuits. The inventors previously designed a vector formatter that provides high performance specifications such as low skew specifications and low jitter specifications on the critical paths of the integrated circuit device.

Coarse timing edges, however, generally require some fine tuning. In a previous design, the output signal of the vector formatter is conventionally driven into a BT605 time vernier (Brooktree Corporation, San Diego, Calif.), which performs a fine time adjustment to skew (fine tune with respect to time) the input coarse edge. In contrast to the vector formatter which is implemented in CMOS technology, the Brooktree BT605 is implemented in bipolar technology, which has a high power requirement.

The bipolar solution is also limited in bandwidth due to the ramp-comparator technique. The ramp-comparator technique involves charging a capacitor with a constant current, and producing a voltage ramp, which is subsequently compared to a reference voltage with a comparator. The technique limits the bandwidth due to discharging the capacitor between edges. Because an N number of BT605 circuits are required, where N is the number of functional test pins times the number of data format types per edge, the power and space requirements of this circuit and its supporting circuitry are multiplied by N. Therefore, by eliminating the bipolar time vernier and integrating the vector formatter and time vernier functions on one silicon die, which is fabricated using CMOS technology, the resulting system would have greatly reduced power and space requirements. The challenge of designing such a system would be to design a time vernier using CMOS technology that would at least meet the performance of the conventional bipolar circuit. This task was a challenge since bipolar technology is usually considered to have higher bandwidth performance than CMOS technology.

Although some CMOS time vernier designs exist, that is adjusting coarse timing edges finely in time, performance with respect to skew and jitter were not sufficient. (See Branson et al.'s article titled "Integrated PIN Electronics for a VLSI Test System," IEEE International Test Conference, 1988 pp. 23–27.) These techniques involved multiple delay elements which were tapped or multiplexed to obtain the desired delay. A large look-up table RAM and redundant hardware elements were needed for calibration. However, with these existing CMOS circuits, skew and linearity performance were still not sufficient with respect to market requirements. Hence, previous CMOS integration of delay lines has only been used for lower performance systems. Bipolar subsystems which consume high power have been required to implement high performance fine timing generation.

SUMMARY OF THE INVENTION

The present invention is directed to a time vernier providing fine timing control of an input signal having coarse timing edges. The time vernier comprises a receiving means for receiving a value representing a desired time delay to be added to the coarse timing edge input. The desired time delay may have both fine and coarse delay aspects. The time vernier also comprises a first decoding means for decoding the fine delay aspect and generating fine delay control signals, as well as a second decoding means for decoding a coarse delay aspect and generating coarse delay control signals. A delay line is also included in the time vernier which has inputs to receive the input signal having coarse timing edges, the fine and coarse delay control signals, and a control voltage which automatically adjusts with temperature and power supply variations, so as to provide for temperature and power supply compensation. The delay line combines the fine and coarse delay control signals to provide an output signal with fine timing edges.

The receiving means of the time vernier further comprises a register for storing bits associated with the desired time delay and corresponding to the fine and coarse delay aspects of the desired delay. The first decoding means further comprises a RAM having its address input connected to the register for storing data for the fine delay aspect, and a fine delay decode unit having an input connected to the RAM for decoding the data and providing decoded results to the delay line. Second decoding means further comprises a coarse delay decode unit for decoding the coarse delay aspect bits and providing further decoded results to the delay line.

The present invention is also directed to a method for calibration to compensate for manufacturing process irregularities.

FEATURES AND ADVANTAGES OF THE INVENTION

The present invention overcomes the deficiencies of known techniques, as noted above, and further provides for the following advantages.

One advantage of using the present invention is an automated calibration method of fine and coarse delay for fabrication process variations and photolithography variations across an integrated circuit chip.

The present invention utilizes a calibration process which is controlled by a calibration logger which statistically improves the calibration accuracy.

The present invention utilizes a delay line and a calibration logger which is configured such that the present invention may indirectly measure its own delay with respect to a precise timing edge, and thus test itself during production testing.

The present invention utilizes a pseudo-NMOS implementation which enables a control voltage to be used to set the speed of the device; in essence, a variable control voltage is provided so that a user can compensate for process variations, for example.

The present invention is implemented using a pseudo-NMOS technology, which is compatible with CMOS technology, thereby providing more functionality at a greatly reduced power requirement compared to similar implementations with other technologies requiring more power. As a result, this system is more easily integrated with other systems that are implemented using CMOS rather than, for example, bi-polar technology. Further, since CMOS provides more functionality at greatly reduced power, the need for water cooling required for some applications using bipolar parts is eliminated.

The present invention provides a general method for temperature and power supply compensation based on a current referenced current mirror and pseudo-NMOS circuitry. This pseudo-NMOS circuitry has significantly less sensitivity of delay with respect to temperature and power supply changes as compared to conventional CMOS.

The present invention uses a phase detector which enables the implementation of the equivalent of a phase-locked loop function to perform calibrations.

Further advantages of the present invention will become apparent to one skilled in the art upon examination of the following drawings and the detailed description. It is intended that any additional advantages be incorporated herein.

BRIEF DESCRIPTION OF THE DRAWINGS

The present invention, as defined in the claims, can be better understood with reference to the text and to the following drawings.

DETAILED DESCRIPTION OF THE PREFERRED EMBODIMENTS

Figure 1:
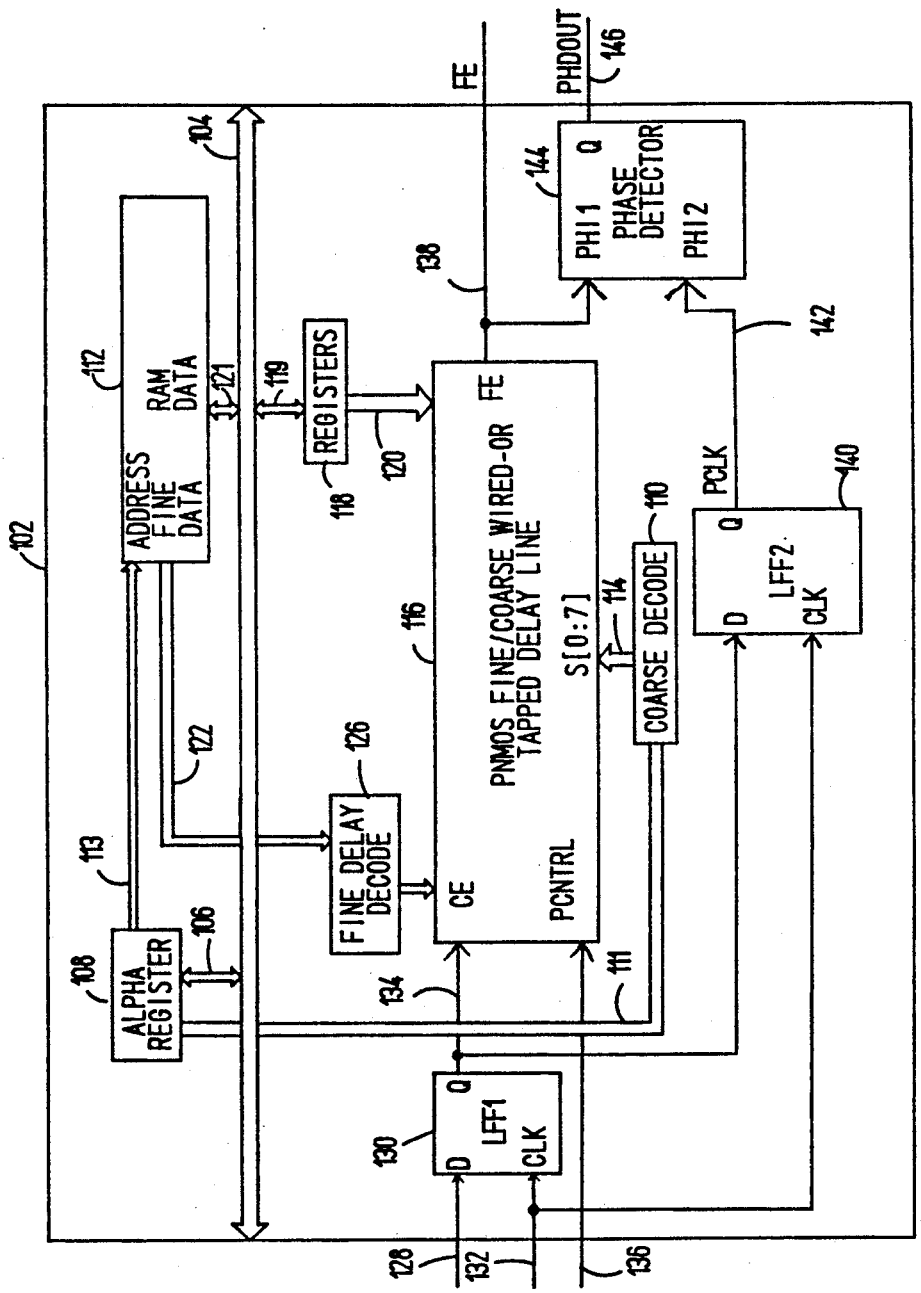
FIG. 1 is a high level block diagram of a preferred embodiment of the architecture of the present invention.

The present invention is directed to a time vernier and method that can be used for integrated circuit testing in computer test systems for providing fine control of an input signal having a coarse timing edge. The time vernier of the present invention is programmable with a digital value which represents a desired time delay. Fine control of a coarse timing edge is useful for testing and characterizing integrated circuit chips.

The present invention has applicability in Integrated Circuit (IC) test environments that require an ability to compensate for temperature, power supply and process variations. This applicability is necessary for isolating the behavior of a circuit-under-test from that of the test system.

In accordance with the present invention, the architecture enables a method of calibration to be implemented. The architecture comprises a pseudo-NMOS (called PNMOS) Fine/Coarse wired-OR Tapped Delay Line and supporting circuitry. The PNMOS wired-OR Delay Line combines coarse and fine delay generation of timing edges into a single tapped delay line and is described in detail in the above referenced application Ser. No. 07/786,459. The support circuitry comprises: 1) a data register which receives a digital value representing a desired time delay to be added to a coarse timing edge input to the present invention; 2) a RAM which provides the calibration memory for the fine delay aspect of the programmed digital delay; 3) a register bank which provides the calibration memory for the coarse delay aspect of the programmed digital delay; 4) decode circuitry for each of the fine and coarse aspects of the programmed digital delay to be input to the PNMOS wired-OR Tapped Delay Line to obtain a desired fine edge (FE) output; and 5) calibration circuitry to support various calibration procedures.

The pseudo-NMOS implementation of this and the related cases provides fine control of a negative timing edge of a coarse input signal. The PMOS gates of buffers internal to the PNMOS wired-OR Tapped Delay Line are driven by the output (PCNTRL) of a variable width current mirror DAC, where N is a digital input to the DAC and the transfer function between the output of the current mirror and the digital input is inversely dependent on N. Since the DAC is referenced to a stable fixed current source, PCNTRL automatically adjusts with temperature and power supply variations so as to negate the effect on the integrated circuit.

Hence, temperature and power supply compensation is provided.

As mentioned, the pseudo-NMOS implementations are utilized for delaying negative timing edges. Further embodiments of the present invention include pseudo-PMOS circuits for controlled delay of positive timing edges. Still further embodiments of the present invention include pseudo-NMOS/PMOS circuits for controlled delay of both negative and positive edges. This particular delay can be accomplished by either alternating a pseudo-PMOS element and a pseudo-NMOS element or by constructing an element with both PMOS and NMOS control voltages.

In brief, the present invention is a time vernier and method that can be used for integrated circuit testing in IC test systems for providing fine control of a coarse timing edge input. Specifically, the present invention provides a time vernier that is programmable with a digital value which represents a desired time delay. The time vernier and method of the present invention is shown at a high level architectural in FIG. 1, where a coarse timing edge signal CE is delayed by the delay line to generate a fine edge signal FE.

FIG. 1 shows a block diagram of a time vernier 102, which is used to provide a well-controlled fine timing edge output from a coarse timing edge input. A data bus 104 provides an input signal 106 to alpha Register 108. The input 106 specifies a desired programmed digital delay which is stored in the alpha register 108. The Most Significant Bits (MSBs) of the value stored in alpha register 108 are received by a coarse decode 110 via bus 111. The Least Significant Bits (LSBs) of the value in alpha register 108, which define the fine delay to be provided by the time vernier 102, are received as an address to a RAM 112 via bus 113.

The coarse decode 110 decodes the MSBs of the value stored in alpha register 108 to provide a select input 114 to a PNMOS wired-OR Tapped Delay Line 116, which functions to combine a fine and coarse delay generation of the input timing edge 106 into a single tapped delay line. This function of the PNMOS wired-OR Tapped Delay Line 116 is described in detail in the above referenced application Ser. No. 07/786,459. Register bank 118 provides storage, accessible from the data bus 104 via a bus 119 and to the PNMOS wired-OR Tapped Delay Line 116 via a bus 120, for the calibration data required by the coarse delay elements (described in above-referenced application Ser. No. 07/786,459) that internally make up a portion of the PNMOS wired-OR Tapped Delay Line 116.

The RAM 112 provides storage for the calibration data for the fine delay specified by the Least Significant Bits (LSBs) of the value stored in alpha register 108. A bus 121 provides access from the data bus 104 to the RAM 112. A bus 122 provides access from the RAM 112 to a fine delay decoder 124, which functions to decode the RAM 112 binary data into a combination of binary and thermometer decoding. This combined decoding provides improved linearity. Thermometer decoding (described in detail in above-referenced application Ser. No. 07/786,690) is used among the multitude of delay elements (inter-delay-element) which comprise the PNMOS wired-OR Tapped Delay Line 116. Binary decoding (described in detail in above-referenced application Ser. No. 07/786,690) is used within each delay element (intra-delay-element) which comprise the PNMOS wired-OR Delay Line 116. Bus 126 provides access from the fine delay decoder 124 to the PNMOS wired-OR Delay Line 116.

Further referring to FIG. 1, an input signal 128 is a data input that is input along with a system clock signal CLK 132 to a Last-Flip-Flop-1 (LFF1) 130. The output stage of LFF1 130 is implemented in PNMOS in order to gain power supply and temperature compensation. The input signal 128 is clocked to generate a CE (Coarse Edge) signal 134 to be input to the PNMOS wired-OR Tapped Delay Line 116 of the time vernier 102. The PNMOS wire-OR Tapped Delay Line 116 also receives a PCNTRL signal 136 as a control voltage for the PNMOS implementation. A well-controlled delay edge corresponding to the programmed delay received via signal 106 is outputted as a fine edge (FE) output signal 138.

Additionally, the CE signal 134 is input to the D-input of a LFF2 (Last-Flip-Flop-2) 140, which is also clocked by the signal CLK 132. The LFF2 140 is structurally identical to the LFF1 130 because the delay characteristics of LFF2 140 should match those characteristics of LFF1 130. On a next signal CLK 132 after receiving the CE signal 134, the LFF2 140 provides a reference edge signal PCLK 142 to a phase detector 144. This phase detector 144 also receives the FE signal 138. The phase detector 144 compares the period of signal CLK 132 to the delay line delay specified by FE signal 138. A PHDOUT output signal 146 specifies a logic "1" if the delay line delay specified by FE signal 138 is less than one clock period of signal PCLK 142; otherwise, the PHDOUT output signal 146 specifies a logic "0".

The architecture of the present invention has a calibration method that complements the architecture. Calibration may be required for several reasons. The need for calibration includes process variations from different lots of the same chip or device mismatches on the same chip. The architecture of the present invention supports three preferred calibration procedures: 1) PCNTRL calibration, which compensates for process variations; 2) Fine Delay calibration, which compensates for device mismatch in the fine delay elements; 3) Coarse Delay calibration, which compensates for device mismatch in the coarse delay elements. Depending on the particular system requirements, some or all of the above calibration procedures may or may not be required.

Each of the above calibration procedures requires a precise time reference. This time reference comes in the form of a finely controlled, conventional clock period, signal CLK 132 of FIG. 1. The method of calibration is controlled by a digital control circuit (calibration logger) and enables averaging of data in order to statistically improve the calibration. Those skilled in the art will readily perceive many conventional techniques to accomplish the storage and counting of the calibration logger. The specifics of the calibration logger are not necessary for one skilled in the art to carry out the present invention. The calibration logger may comprise several counters, registers, and digital logic or the like. The purpose of the logger circuit is to monitor and store a total count of the several phase detector output results and compare them to a threshold value that has been previously programmed into the calibration logger. This compare enables the calibration logger to determine whether the timing edge in question has the desired timing. The calibration logger also provides for a means for the circuit to indirectly make a sensitive timing measurement; thus to test itself during production testing.

The calibration procedure can be described by referring to two consecutive rising edges of the clock CLK 132 in FIG. 1. The first edge drives CE into the delay line 116 and also sets up a second flip-flop, LFF2 140. The LFF2 140 is clocked by CLK 132 and generates an output PCLK 142, which subsequently becomes a second clock which drives the phase detector. Therefore, when the period, namely, the time between two consecutive edges of the clock CLK 132, is programmed to be the delay desired by the delay line 116, then the FE output 138 goes high at the same time that the second clock, PCLK 142, has its rising edge. If the FE output 138 signal edge and the PCLK 142 signal edge do not line up as indicated above, FE output 138 is out of calibration. Hence, the delay outputted by the delay line 116 is adjusted until the FE output 138 signal edge and the PCLK 142 signal edge line up as indicated above. The results of this calibration process are stored in the RAM 112, the registers 118, or the DAC (described in detail in above-referenced application Ser. No. 07/786,690), depending on whether Fine Calibration, Coarse Calibration, or PCNTRL signal 136, respectively, is being calibrated. In essence, PHD OUT 146 drives a feedback section that emulates a phase-locked loop function and enables calibration of the present invention to be performed through constant digital adjustment of the period of the clock until it matches the desired delay through the delay line 116.

Figure 2:
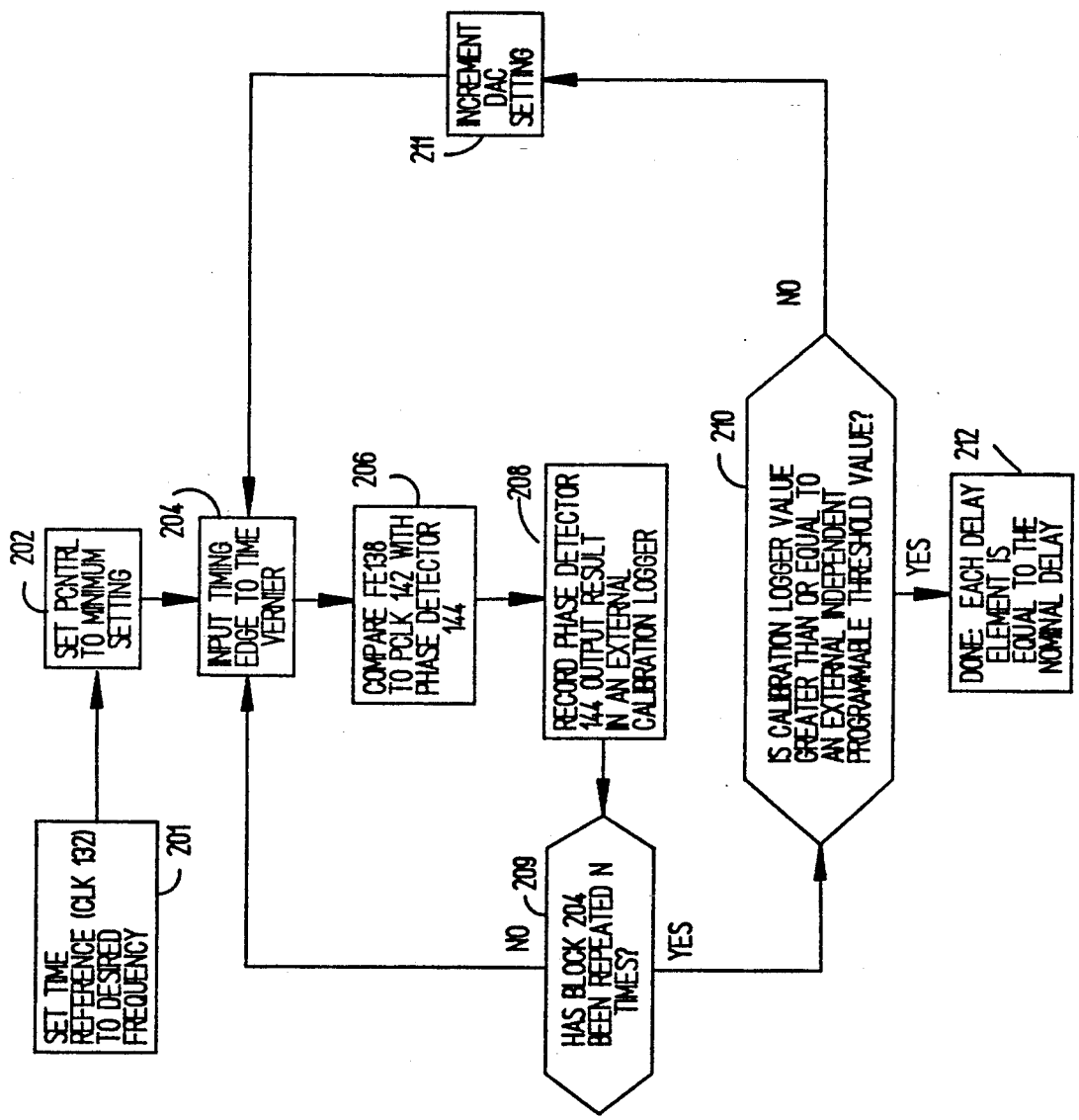
FIG. 2 is a flow chart of a preferred method of PCNTRL control voltage calibration utilized in a preferred embodiment of the present invention.
Figure 3:
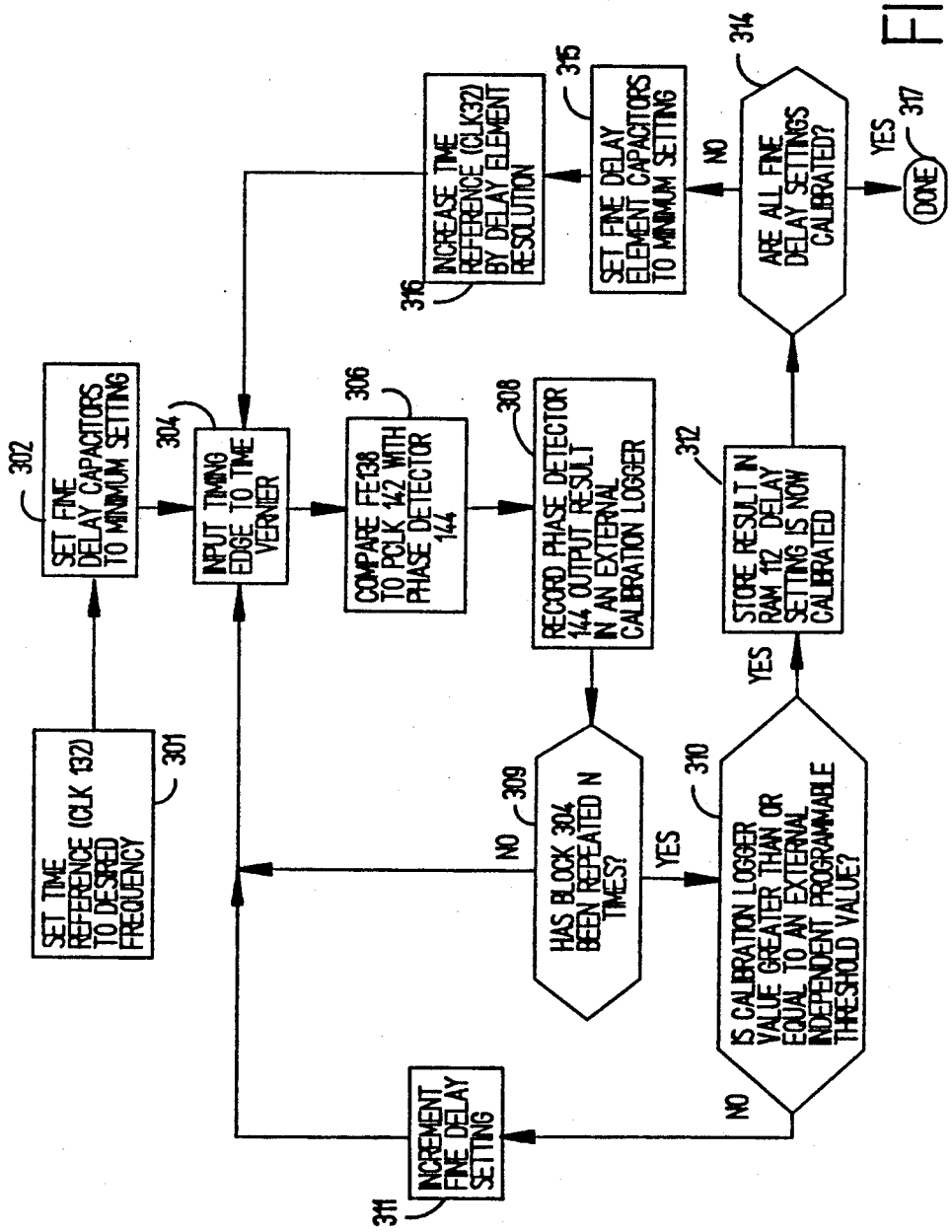
FIG. 3 is a flow chart of a preferred method of fine delay calibration utilized in a preferred embodiment of the present invention.
Figure 4:
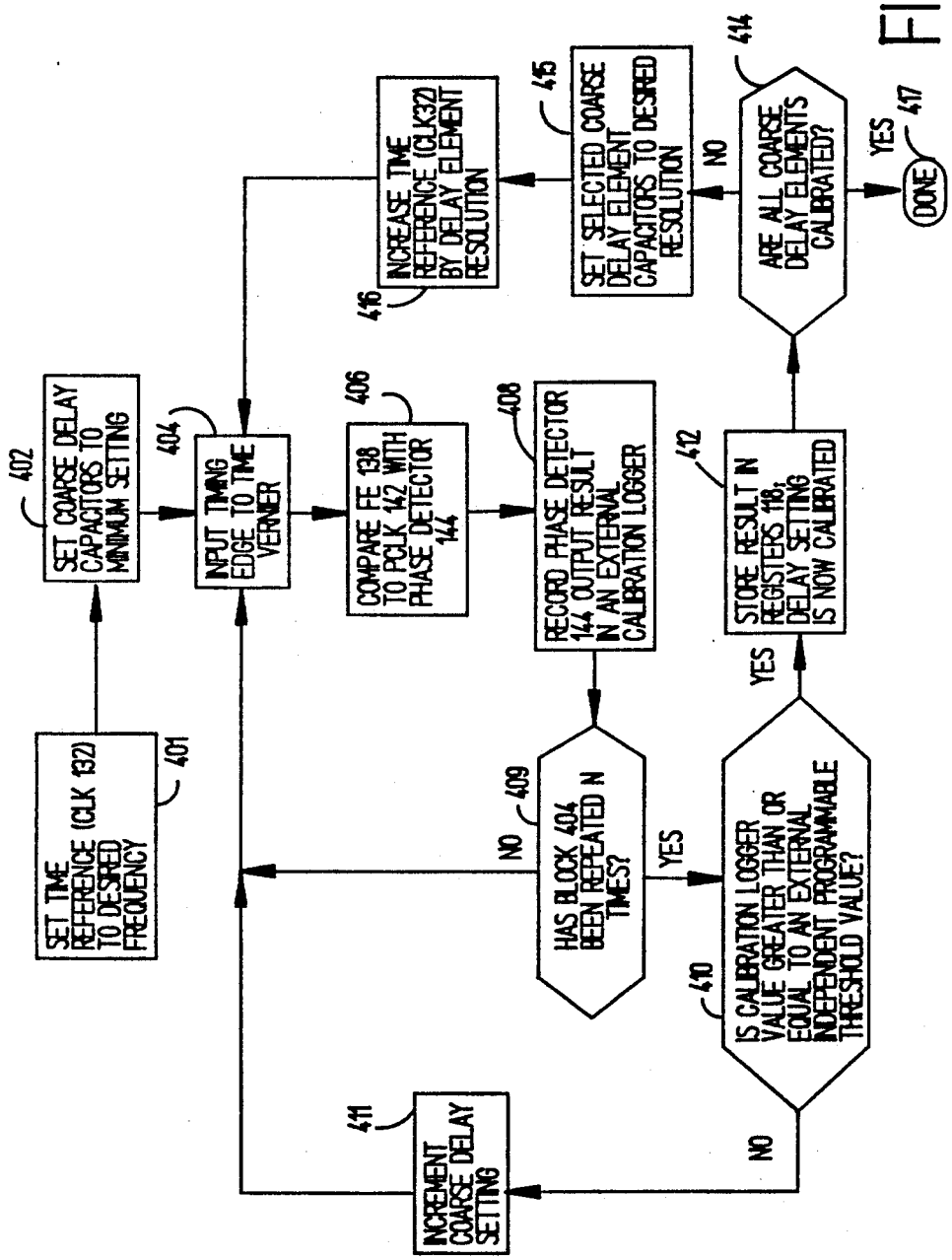
FIG. 4 is a flow chart of a preferred method of coarse delay calibration utilized in a preferred embodiment of the present invention.

FIGS. 2, 3 and 4 show flow charts of methods of calibration to be utilized with a preferred embodiment of the present invention illustrated in FIG. 1. FIG. 2 is a flow chart of a method of PCNTRL calibration which compensates for process variations.

Referring to FIG. 2, a PCNTRL calibration procedure programs all of the delay elements internal to the PNMOS wired-OR Tapped Delay Line 116 to a nominal capacitor setting. The PCNTRL calibration procedure begins with block 201 by setting a time reference (CLK 132) to a desired frequency. As an ongoing example to assist in explaining this method, if a desired delay to be calibrated is 8 ns, then the time reference CLK 132 should be set with a period of 8 ns. This setting means that the time between one rising edge and a consecutive rising edge is 8 ns. Note in the ongoing example that if each delay element of the delay line 116 has a 2 ns nominal delay, then four delay elements would be needed in order for the delay line 116 to provide the desired delay of 8 ns. The Digital-to-Analog Converter (DAC, described in above-referenced application Ser. No. 07/786,690), which generates the control voltage PCNTRL 136 to be calibrated, is then set to its lowest setting as shown in block 202, in order to generate the minimum control voltage PCNTRL 136. Note in the ongoing example that this minimum setting for PCNTRL 136 must enable the delay line 116 to generate a delay which is less than the 8 ns desired delay in order that the 8 ns desired delay may be approached by slowly incrementing PCNTRL 136.

Next, block 204 indicates that a timing edge is input to the time vernier 102 via the input signal 128. Block 206 illustrates that the delayed edge, FE output 138, is compared to the PCLK 142 (which is generated by time reference CLK 132 and has an identical clock period) by the phase detector 144. As mentioned in the description of FIG. 1, the PHDOUT output signal 146 specifies a logic "1" if the delay from the delay line 116 on FE signal 138 is less than one clock period of PCLK signal 142; otherwise, the PHDOUT output signal 146 specifies a logic "0". The external calibration logger then records the PHDOUT output signal 146 as indicated by block 208, thereby counting the number of times the output is high.

Decision block 209 indicates that the process from block 204 is repeated N times, where N is a digital number programmed into the calibration logger. The repeat of this cycle from block 204 to 209 is necessary when the delay of the delay line 116 approaches the period of the time reference CLK 132, because at this point the phase detector 144 enters an instability mode where the output becomes uncertain; therefore the output must be determined by probability. Hence, as N increases, the probability that the correct output is determined correctly increases.

At the point when the correct output has reasonably been determined through N successive iterations, decision block 210 determines if the count value stored as a calibration logger value, which represents the total number of times that the phase detector 144 returned a "1" result, is greater than or equal to an external independent programmable threshold value. If so, as shown by block 212, each delay element is equal to the nominal delay, which means that the delay of the delay line 116 is calibrated to approximate the delay specified by the period of the time reference CLK 132. Therefore, the PCNTRL 136 control voltage is now calibrated with respect to fabrication process variations.

Otherwise, as shown by the "No" branch from block 210, the setting of the digital-to-analog converter, which controls the control voltage PCNTRL 136, is incremented by 1 LSB so as to increase the control voltage PCNTRL 136 and thereby increase the delay provided by each delay element comprising the delay line 116. The procedure is repeated from block 204 until decision block 210 follows the "Yes" branch to block 212.

FIG. 3 is a flow chart of a method of Fine Delay calibration which compensates for device mismatch in the fine delay elements. In essence, the fine delay elements are calibrated for on-chip photolithography variations. The Fine Delay calibration procedure begins with block 301 by setting a time reference (CLK 132) to a desired frequency. As an ongoing example to assist in explaining this method, if a desired delay to be calibrated is 8 ns, then the time reference CLK 132 should be set with a period of 8 ns. This setting means that the time between one rising edge and a consecutive rising edge is 8 ns. Next, block 302 shows that the capacitor settings for the fine delay elements, contained within the PNMOS wired-OR tapped delay line, are set to the minimum setting. For the ongoing example this would correspond to a fine delay of less than 8 ns.

Next, block 304 indicates that a timing edge is input to the time vernier 102 via the input signal 128. Block 306 illustrates that the delayed edge, FE output 138, is compared to the PCLK 142 (which is generated by time reference CLK 132 and has an identical clock period) by the phase detector 144. As mentioned in the description of FIG. 1, the PHDOUT output signal 146 specifies a logic "1" if the delay from the delay line 116 on FE signal 138 is less than one clock period of signal PCLK 142; otherwise, the PHDOUT output signal 146 specifies a logic "0". The external calibration logger then records the PHDOUT output signal 146 as indicated by block 308, thereby counting the number of times the output is high.

Decision block 309 indicates that the process from block 304 is repeated N times, where N is a digital number programmed into the calibration logger. The repeat of this cycle from block 304 to 309 is necessary when the delay of the delay line 116 approaches the period of the time reference CLK 132, because at this point the phase detector 144 enters an instability mode where the output becomes uncertain; therefore the output must be determined by probability. Hence, as N increases, the probability that the output is determined correctly increases.

At decision block 310, the system determines if the count value stored as a calibration logger value, which represents the total number of times that the phase detector 144 returned a logic "1" result, is greater than or equal to an external independent programmable threshold value. If not, as shown by block 311, the fine delay element capacitors are incremented by one setting, and the process repeats from block 304. If the decision in block 310 is a "yes", then block 312 shows that the first fine delay setting is now calibrated to the desired fine delay with respect to on-chip photolithography variations (described in detail in above-referenced application Ser. No. 07/786,690), and this result is stored in the RAM 112.

Since the method involves multiple fine delay settings, decision block 314 checks whether all fine delay settings have been calibrated. If not, the fine delay element capacitors are switched to a minimum setting, as shown at block 315. Then, the time reference CLK 132 is increased by one delay element resolution, as shown at block 316. The process is then repeated from block 304 for this next fine delay setting. As block 317 shows, the fine delay element calibration method is complete when all fine delay settings are calibrated.

FIG. 4 is a flow chart of a preferred method of Coarse Delay calibration which compensates for device mismatch in the coarse delay elements. In essence, the coarse delay elements are calibrated for on-chip photolithography variations and variations through the tapped delay line. The Coarse Delay calibration procedure begins with block 401 by setting a time reference (CLK 132) to a desired frequency. Next, block 402 shows that the capacitor settings of a first coarse delay element internal to the PNMOS wired-OR Tapped Delay Line 116 are programmed to their minimum setting. Note that this minimum setting corresponds to an overall delay of less than the "desired delay".

Next, block 404 indicates that a timing edge is input to the time vernier 102 via the input signal 128. Block 406 illustrates that the delayed edge, FE output 138, is compared to the PCLK 142 (which is generated by time reference CLK 132 and has an identical clock period) by the phase detector 144. As mentioned in the description of FIG. 1, the PHDOUT output signal 146 specifies a logic "1" if the delay from the delay line 116 on FE signal 138 is less than one clock period of signal PCLK 142; otherwise, the PHDOUT output signal 146 specifies a logic "0". The external calibration logger then records the PHDOUT output signal 146 as indicated by block 408, thereby counting the number of times the output is high.

Decision block 409 indicates that the process from block 404 is repeated N times, where N is a digital number programmed into the calibration logger. The repeat of this cycle from block 404 to 409 is necessary when the delay of the delay line 116 approaches the period of the time reference CLK 132, because at this point the phase detector 144 enters an instability mode where the output becomes uncertain; therefore the output must be determined by probability. Hence, as N increases, the probability that the correct output is determined correctly increases.

At the point when the correct output has reasonably been determined through N successive iterations, decision block 410 determines if the count value stored as a calibration logger value, which represents the total number of times that the phase detector 144 returned a logic "1" result, is greater than or equal to an external independent programmable threshold value. If not, as shown by block 311, the coarse delay element capacitors are incremented by one-setting, and the process repeats from block 404. If the decision in block 310 is a "yes", then block 312 shows that the first coarse delay element is now calibrated to the desired coarse delay with respect to on-chip photolithography variations (described in detail in above-referenced application Ser. No. 07/786,690), and this result is stored in the Registers 118.

Since the method could involve multiple coarse delay elements, decision block 414 checks whether all coarse delay elements have been calibrated. If not, the fine delay element capacitors are switched to a desired resolution, as shown at step 415. Then the time reference CLK 132 is increased by one delay element resolution, as shown at block 416, which in effect includes a next coarse delay element into the calibration. The process is then repeated from block 404 for this next coarse delay element. As block 417 shows, the coarse delay element calibration method is complete when all coarse delay elements are calibrated.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

What is claimed is:

1. A time vernier for providing fine control of an input signal having coarse timing edges, comprising:
   (a) receiving means for receiving a value representing a desired time delay to be added to the coarse timing edge input, said desired time delay having fine and coarse delay aspects;
   (b) first decoding means for decoding said fine delay aspect and generating fine delay control signals;
   (c) second decoding means for decoding said coarse delay aspect and generating coarse delay control signals; and
   (d) a delay line having inputs which receive the input signal having coarse timing edges, said fine and coarse control signals, and a control voltage which automatically adjusts with temperature and power supply variations, so as to provide for temperature and power supply compensation, said delay line combining said fine and coarse delay signals to provide an output signal with fine timing edges.

2. A time vernier according to claim 1 wherein said desired time delay is in the form of a digital signal.

3. A time vernier according to claim 2, wherein said receiving means further comprises a register for storing bits associated with said desired time delay digital signal and corresponding to said fine and coarse delay aspects of said desired delay.

4. A time vernier according to claim 3, wherein said first decoding means further comprises a RAM having an input connected to said register for storing data for said fine delay aspect, and a fine delay decoder unit having an input connected to said RAM, for decoding said data and providing decoded results to said delay line.

5. A time vernier according to claim 3, wherein said second decoding unit further comprises a plurality of registers for storing said bits associated with said delay line, and a coarse delay decoder unit having an input connected to said register, for decoding said coarse delay aspect bits and providing further decoded results to said delay line.

6. A method for calibrating a control voltage input signal to a time vernier used for providing fine control of an input signal having coarse timing edges input, comprising the steps of:
 (1) setting a time reference to a desired delay;
 (2) setting the control voltage input signal to a first level;
 (3) receiving the input signal having coarse timing edges in the time vernier to generate an output signal having fine timing edges;
 (4) comparing a delay of said output signal having fine timing edges to a system clock period with a phase detector to generate a phase detector output signal;
 (5) recording said phase detector output signal in a counting means for counting a maximum amount of times step (4) was performed;
 (6) performing steps (3), (4), and (5) a predetermined number of times; and
 (7) incrementing the control voltage input signal in step (2) and repeating from step (3) if said maximum amount in step (5) is not greater than or equal to a threshold value.

7. A method according to claim 6, wherein said threshold value is programmable.

8. A method for calibrating a time vernier used for providing fine control of a coarse timing edge input, which method comprising the steps of:
 (1) setting a time reference to a desired delay;
 (2) setting a first delay element to a minimum delay;
 (3) inputting a coarse timing edge input signal to the time vernier and generating an output signal having fine timing edges;
 (4) comparing a delay of said output signal having fine timing edges to a system clock period with a phase detector to generate a phase detector output signal;
 (5) recording said phase detector output signal in a counting means for counting a maximum amount of times step (4) was performed;
 (6) performing steps (3), (4), and (5) a predetermined number of times;
 (7) incrementing the delay element setting in step (2) and repeating from step (3) if said maximum amount in step (5) is not greater than or equal to a threshold value.
 (8) storing the delay element setting in a storage means for storing data and incrementing said time reference in step (1) and repeating from step (3) if said maximum amount in step (5) is not greater than or equal to a threshold value.

9. The method of claim 8, wherein said method calibrates by compensating for device mismatches in coarse delay elements.

10. The method of claim 8, wherein said method calibrates by compensating for device mismatches in fine delay elements.

* * * * *